US011393787B2

(12) United States Patent
Lee et al.

(10) Patent No.: US 11,393,787 B2
(45) Date of Patent: Jul. 19, 2022

(54) CONDUCTOR DESIGN FOR INTEGRATED MAGNETIC DEVICES

(71) Applicant: TEXAS INSTRUMENTS INCORPORATED, Dallas, TX (US)

(72) Inventors: Dok Won Lee, Mountain View, CA (US); William D. French, San Jose, CA (US); Ann Gabrys, Santa Clara, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 64 days.

(21) Appl. No.: 16/264,733

(22) Filed: Feb. 1, 2019

(65) Prior Publication Data
US 2019/0164934 A1    May 30, 2019

Related U.S. Application Data

(62) Division of application No. 14/286,600, filed on May 23, 2014, now abandoned.

(51) Int. Cl.
*H01L 29/82* (2006.01)
*H01L 25/065* (2006.01)
(Continued)

(52) U.S. Cl.
CPC ..... *H01L 25/0655* (2013.01); *H01F 17/0013* (2013.01); *H01F 17/0033* (2013.01);
(Continued)

(58) Field of Classification Search
CPC ..... H01L 27/0288; H01L 28/00; H01L 28/10; H01L 2924/1206; H01L 2924/19042; H01L 21/67; H01L 21/67005; H01L 21/67709; H01L 27/14; H01L 27/16; H01L 27/20; H01L 27/22; H01L 27/222; H01L 27/30; H01L 29/82; H01L 31/00; H01L 35/00; H01L 37/00; H01L 41/00; H01L 41/06; H01L 41/12; H01L 41/20; H01L 41/47; H01L 43/00; H01L 43/08; H01L 47/023; H01L 51/00; H01L 2224/75733; H01L 23/5227; H01L 23/5329; H01L 23/5226; H01L 24/17; H01L 24/33; H01L 24/80; H01L 25/105; H01L 24/11; H01L 23/5222; H01L 2224/05567; H01L 2224/05548; H01L 2224/0401; H01L 24/05; H01L 24/13; H01L 2224/131; H01L 24/03;
(Continued)

(56) References Cited

U.S. PATENT DOCUMENTS 6,195,232 B1 * 2/2001 Cohen ................. G11B 5/3123
                                                           360/123.38
7,719,084 B2   5/2010 Gardner et al.
(Continued)

OTHER PUBLICATIONS

"Integrated Inductors With Magnetic Materials For On-Chip Power Conversion," Circuits Research Lab & Future Technology Research, Intel Labs, Intel Corporation, pp. 1-36 (Donald S. Gardner).

*Primary Examiner* — Samuel Park
(74) *Attorney, Agent, or Firm* — Andrew R. Ralston; Charles A. Brill; Frank D. Cimino

(57) ABSTRACT

An inductor conductor design which minimizes the impact of skin effect in the conductors at high frequencies in integrated circuits and the method of manufacture thereof is described herein.

23 Claims, 14 Drawing Sheets

(51) Int. Cl.
   *H01L 23/00* (2006.01)
   *H01F 17/00* (2006.01)
   *H01L 23/522* (2006.01)

(52) U.S. Cl.
   CPC .......... *H01L 23/5227* (2013.01); *H01L 24/03* (2013.01); *H01L 24/08* (2013.01); *H01L 24/14* (2013.01); *H01L 24/32* (2013.01); *H01L 24/33* (2013.01); *H01L 24/49* (2013.01); *H01L 25/065* (2013.01); *H01F 2017/0066* (2013.01); *H01F 2017/0086* (2013.01); *H01L 24/05* (2013.01); *H01L 24/13* (2013.01); *H01L 2224/02166* (2013.01); *H01L 2224/0345* (2013.01); *H01L 2224/03622* (2013.01); *H01L 2224/0401* (2013.01); *H01L 2224/0519* (2013.01); *H01L 2224/05647* (2013.01); *H01L 2224/13101* (2013.01); *H01L 2224/1405* (2013.01); *H01L 2224/29666* (2013.01); *H01L 2224/32235* (2013.01); *H01L 2224/33505* (2013.01); *H01L 2224/46* (2013.01); *H01L 2924/00014* (2013.01); *H01L 2924/1203* (2013.01); *H01L 2924/1304* (2013.01)

(58) Field of Classification Search
   CPC ... H01L 2224/0345; H01L 2224/03622; H01L 2224/1705; H01L 2224/30505; H01L 2224/80031; H01L 2224/80862; H01L 2225/1011; H01L 2924/01029; H01L 2924/06; H01L 2924/364; H01L 25/0655; H01L 25/065; H01L 24/32; H01L 24/08; H01L 24/49; H01L 24/14; H01L 2224/05647; H01L 2224/02166; H01L 2224/13101; H01L 2924/1203; H01L 2924/1304; H01L 2924/00014; H01L 2224/32235; H01L 2224/33505; H01L 2224/0519; H01L 2224/46; H01L 2224/29666; H01L 2224/1405; H01L 2924/14; H01L 2924/00; H01L 2924/0002; H01L 23/645; H01L 27/016; H01L 24/06; H01L 27/08; H01F 17/0033; H01F 27/2804; H01F 2027/2809; H01F 17/0013; H01F 2017/0066; H01F 2017/0086

See application file for complete search history.

(56) References Cited

U.S. PATENT DOCUMENTS

2008/0030905 A1*   2/2008   Yamanaka .......... G11B 5/6005
                                                            360/313
   2009/0322461 A1*  12/2009   Hebert ................ H01F 17/0033
                                                             336/83
   2013/0049749 A1*   2/2013   Mohan .................... G01R 33/04
                                                            324/252
   2013/0093032 A1*   4/2013   Webb ...................... H01L 28/10
                                                            257/421
   2014/0048926 A1*   2/2014   Wang ...................... H01L 24/11
                                                            257/737
   2014/0068932 A1    3/2014   Sturcken
   2014/0176383 A1*   6/2014   Yosui ...................... H01Q 7/08
                                                            343/788
   2015/0035718 A1    2/2015   Gouchi et al.

* cited by examiner

CONDUCTOR DESIGN FOR INTEGRATED MAGNETIC DEVICES

CROSS-REFERENCE TO RELATED APPLICATIONS

Under 35 U.S.C. § 120, this divisional application claims the benefit of and priority to U.S. patent application Ser. No. 14/286,600, filed May 23, 2014, the entirety of which is hereby incorporated herein by reference.

FIELD OF THE INVENTION

This invention relates to the field of integrated Inductors. More particularly, this invention relates to inductors and their quality factor at high frequencies.

BACKGROUND OF THE INVENTION

Inductors and transformers may be used in many different types of circuits. For example, they may be used for radio frequency (RF) circuits and high-frequency power distribution or conversion systems, such as a DC-DC voltage (or power) converter. Inductors experience resistance increases in magnetic devices due to effects in both the magnetic core and the conductor. The resistance increase due to the core is assumed to be caused by the magnetic losses in the magnetic core and many try to solve the problem by reducing the magnetic losses. This can mitigate the overall resistance increase by suppressing the magnetic losses, but the resistance increase due to the conductor still exists, limiting the full optimization of device performance. For example, a desired operating frequency may require an inductance quality factor that is unobtainable based on the constrained physical size of the inductor. Further, in particular cases, based due to the skin effect, an on-chip inductor may not have a sufficiently high operating frequency for specific RF or high-frequency voltage conversion applications.

Resistance of integrated magnetic devices (e.g. inductors, transformers) can increase at frequency of operation, which in turn causes the decrease in quality factor.

What is needed is a technique wherein an on chip inductor can be manufactured using a conductor design that minimizes skin effect of the conductor, thereby minimizing the increase in resistance at required switching frequencies.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

In accordance with an embodiment of the present application an integrated magnetic device, wherein the integrated magnetic device comprises: a conventionally formed silicon wafer, having a substrate, an active region comprising transistors, diodes, capacitors and resistors coupled by a conductive interconnect layer, to form an active circuit, wherein the active region touches the top surface of the silicon wafer substrate and includes a first plurality of bond contacts; wherein the conductive interconnect layer is comprised of multiple layers of conductive material with insulating layers therebetween, the multiple layers of conductive material are coupled together by a first plurality of vias piercing their associated insulating layer, wherein the top of the conductive interconnect layer is an insulating layer, having openings to expose a first plurality of bond contacts; also wherein the insulating layer on top of the conductive interconnect layer is covered by a Silicon Nitride layer, having openings to expose the first plurality of bond contacts; a first layer of polymer, having a first plurality of openings extending from the top surface of the first polymer layer down to the plurality of bond contacts, wherein the first plurality of openings are filled with a high conductance material forming a second plurality of vias coupled to the first plurality of bond contacts; a first layer of high conductance material filling the first plurality of openings and overlaying and touching the surface of the first polymer layer, wherein the first layer of high conductance material is defined and configured to include a plurality of rectangular bottom coil members and a coupling means to connect to the second plurality of vias and coupling to the first plurality of bond contacts; the plurality of rectangular bottom coil members, each composed of the first layer of high conductance material, overlaying and touching the first layer of polymer, where each bottom coil member includes, a second plurality of bond contacts at the ends of each of the bottom coil members, one of each of a plurality of bottom slots therein, wherein each of the bottom slots pierces its respective bottom coil member; a second layer of polymer, touching the first layer of polymer and the first layer high conductance material wherein the top surface of the second layer of polymer is planar, the second layer of polymer includes a second plurality of openings extending from the top surface of the second layer of polymer down to the second plurality of contacts, wherein the openings in the second layer of polymer are filled with a third plurality of vias; a layer of titanium touching the second layer of polymer and the tops of the third plurality of vias; a magnetic core selected from a single layer of magnetic core material or a laminated magnetic core material deposited and defined on the top surface of second layer of polymer, wherein the magnetic core, as defined, does not touch the third plurality of vias exposed on the top surface of the second layer of polymer; a third layer of polymer touching the second layer of polymer and the top of the magnetic core material, wherein the third layer of polymer includes a third plurality of openings extending from the top surface of the third layer of polymer down to the top surfaces of the third plurality of vias, wherein the openings in the third layer of polymer are filled with a fourth plurality of vias; a second layer of high conductance material filling the third plurality of openings and overlaying and touching the surface of the third polymer layer, wherein the second layer of high conductance material is defined and configured to include a plurality of rectangular top coil members and coupling to the third plurality of vias; the plurality of rectangular top coil members, composed of the second layer of high conductance material, overlaying and touching the third layer of polymer, where each top coil member includes, a third plurality of bond contacts at the ends of each of the top coil members, wherein each one of the third plurality of bond contacts touching and coupling to one each of the fourth plurality of vias, and of a plurality of top slots therein, wherein each of the top slots pierces its respective top coil member; and a fourth layer of polymer touching the third layer of polymer and the top of the second layer of high conductance material, wherein the fourth layer of polymer includes a fourth plurality of openings extending from the top surface of the fourth lay of polymer down to the top surface of the second layer high conductance material, the openings in the fourth layer of polymer are filled with solder balls, wherein the solder balls provide connection to outside circuitry.

In accordance with another embodiment of the present application a method of forming an integrated magnetic device, wherein the method of forming an integrated magnetic device, comprises: providing a conventionally formed integrated circuit wafer, wherein bond contacts of each of the integrated circuits are exposed through openings in an insulating layer at the top of a conductive interconnect layer; depositing a layer of silicon nitride over the integrated circuit wafer, the layer of silicon nitride touching the insulating layer at the top of the conductive interconnect layer, exposing the bond contacts exposed through the openings in the insulating layer at the top of the conductive interconnect layer by using a pattern and etch process to expose the bond contacts through openings in the silicon nitride layer; depositing a first layer of polymer, having a first plurality of openings extending from the top surface of the first polymer layer down to the plurality of bond contacts, wherein the first plurality of openings are filled with a high conductance material forming a second plurality of vias coupled to the first plurality of bond contacts; depositing and patterning a mold mask through which is electroplated a first layer of high conductance material on the surface of the first polymer layer, which also fills the openings in the first polymer layer, after which the mold mask is removed, thereby coupling the first layer of high conductance material to the first plurality of bond contacts, to form a coupling means to the first plurality of bond contacts and a plurality of bottom coil members which are configured to include either slots or no slots and also include a second plurality of bond contacts at the ends of the bottom coil members; depositing a second layer of polymer, touching the first layer of polymer and the first layer high conductance material wherein the top surface of the second layer of polymer is planar, the second layer of polymer including a second plurality of openings extending from the top surface of the second layer of polymer down through the second layer of polymer to the second plurality of bond contacts; filling the second plurality of openings in the second layer of polymer with a third plurality of vias, thereby coupling the second plurality of vias to the first plurality of bond contacts, wherein a mold mask is deposited and patterned and the third plurality of vias are copper electroplated on the surface of the second polymer layer, also filling the openings in the second polymer layer, after which the mold mask is removed; sputtering a layer of titanium on the top surface of the second layer of polymer touching the second layer of polymer and the tops of the second plurality of vias; depositing a magnetic core selected from a single layer of magnetic core material or a laminated magnetic core material on the top surface of second layer of polymer; patterning and etching using a standard photo resist process the laminated magnetic core, wherein the multiple layers of alternating magnetic material and insulating material and the titanium layer are then etched; stripping the photoresist using standard techniques; subjecting the magnetic layers to a first anneal step to reinforce the magnetic alignment imposed during deposition; depositing a third layer of polymer, touching the second layer of polymer, the third plurality of vias and the top of the magnetic core, the third layer of polymer including a third plurality of openings extending from the top surface of the third layer of polymer down through the third layer of polymer to the third plurality of vias, wherein the third plurality of openings in the third layer of polymer constitute a fourth plurality of vias; depositing and patterning a mold mask, electroplating a second layer of high conductance material on the surface of the third polymer layer, filling the third plurality of openings in the third polymer layer thereby coupling the second layer of high conductance material to the first plurality of bond contacts, wherein the second layer of high conductance material is defined and configured to include a plurality of rectangular top coil members thereby coupling to the third plurality of vias and the second layer of high conductance material is selectively configured to include slots or the absence of slots, after which the mold mask is removed; depositing a fourth layer of polymer, touching the third layer of polymer and the second layer of high conductance material, the fourth layer of polymer including openings extending from the top surface of the fourth layer of polymer down through the fourth layer of polymer to the second layer of high conductance material; subjecting the magnetic layers to a second anneal (300-500° C.) in the presence of a magnetic field (0.1-1 T), wherein the second anneal further defines the easy/hard axes; and forming solder bumps in the openings formed in the fourth layer of polymer touching the third layer of high conductance material.

DESCRIPTION OF THE VIEWS OF THE DRAWING

In the drawings, like reference numerals are sometimes used to designate like structural elements. It should also be appreciated that the depictions in the figures are diagrammatic and not to scale.

DETAILED DESCRIPTION OF EXAMPLE EMBODIMENTS

Figure 1:
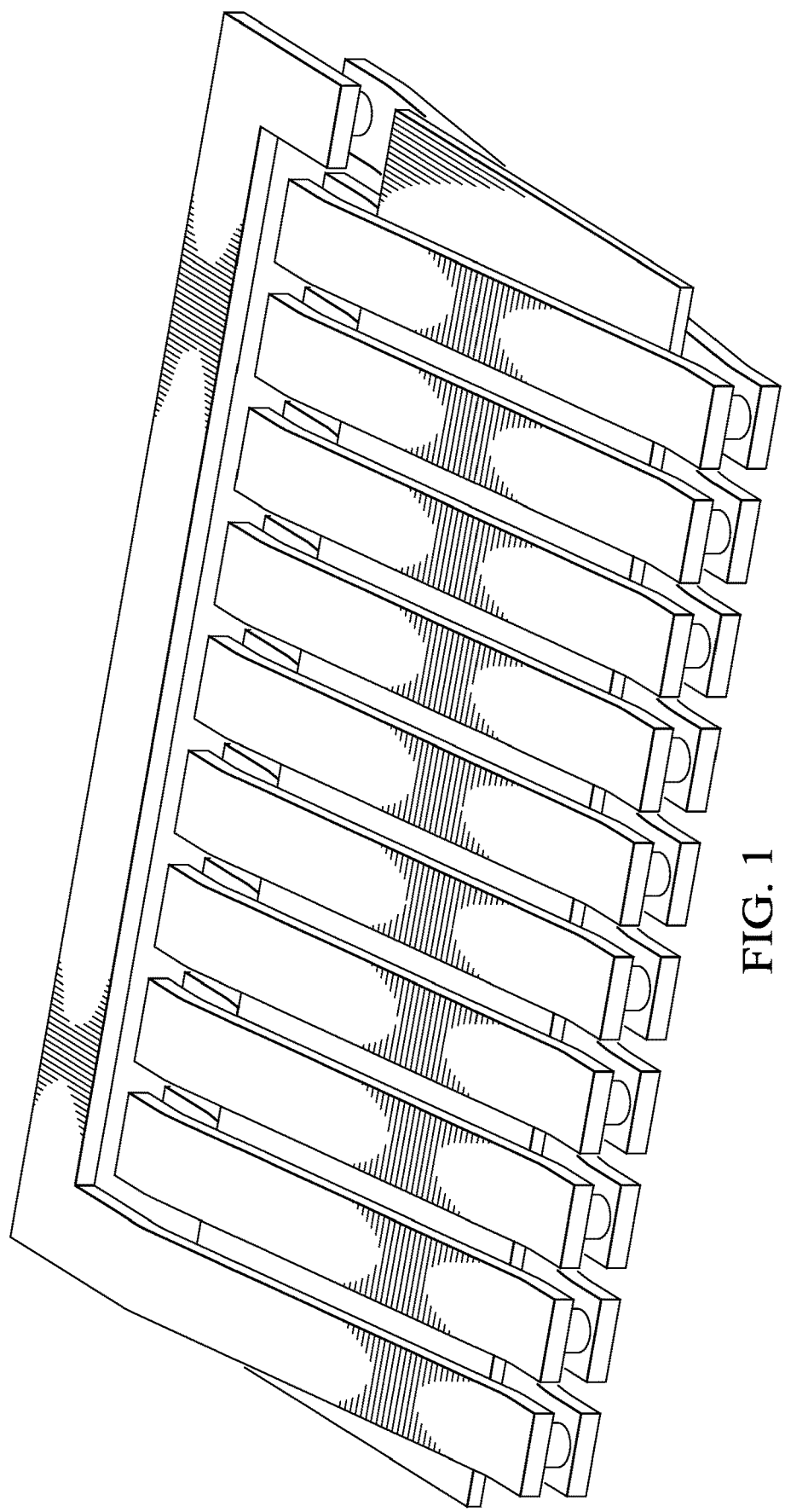
FIG. 1 is an illustration of an inductor including a coil without slots formed according to embodiments of this invention.

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Embodiments of a conductor design which minimizes the impact of skin effect in the conductors at high frequencies in integrated circuits and the method of manufacture thereof will be described. Reference will now be made in detail to a description of these embodiments as illustrated in the drawings. While the embodiments will be described in connection with these drawings, there is no intent to limit them to drawings disclosed herein. On the contrary, the intent is to cover all alternatives, modifications, and equivalents within the spirit and scope of the described embodiments as defined by the accompanying claims. Simply stated, an embodiment is an inductor that may include a laminated material magnetic core structure to decrease eddy currents therein that may limit the operation of the inductor at high frequency. The inductor of an embodiment may include a plurality of metal lines substantially or completely surrounding a magnetic material. The inductor of an embodiment may also include a laminated magnetic layer or layers that may further include higher resistance or insulator layers. The increased resistance of the laminated magnetic layers may reduce eddy currents within the inductor and subsequently improve the performance of the inductor at higher frequencies.

In operation, the plurality of metal lines substantially or completely surrounding a magnetic material may experience resistance increases at higher frequencies. Resistance increases caused by skin effect at high frequencies can be reduced by introducing the slotting in the conductor winding. The skin effect acts to force the current in the wire to flow close to its surface and away from the center. The slots create more surface area within the metal where the skin effect occurs, and less internal metal areas with lower current, which will therefore result in a higher current density through the wire as a whole, thus a lower effective resistance. As a result, a higher quality factor can be achieved at frequencies of interest.

Figure 2:
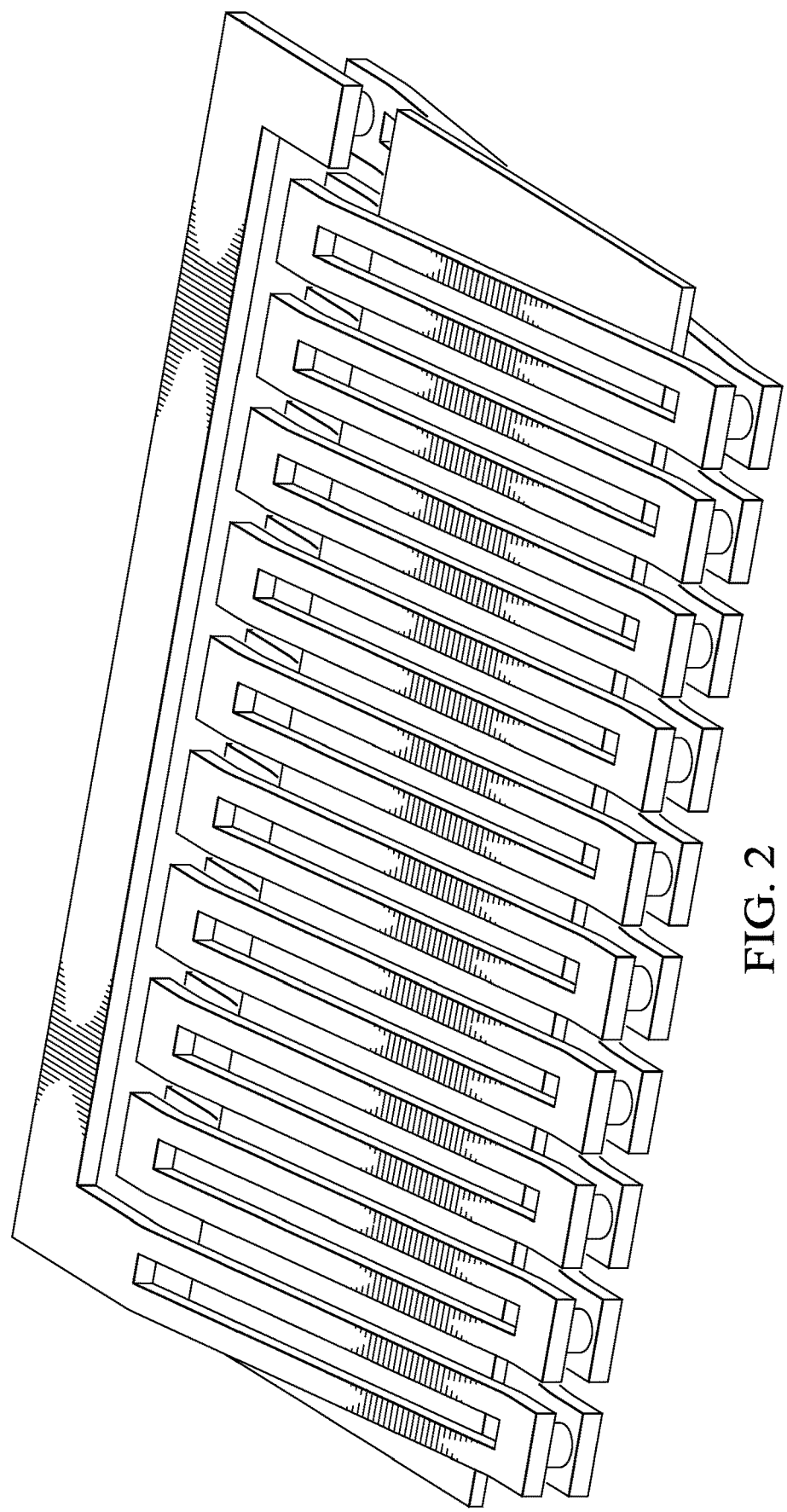
FIG. 2 is an illustration of an inductor including a coil with slots formed according to embodiments of this invention.
Figure 4:
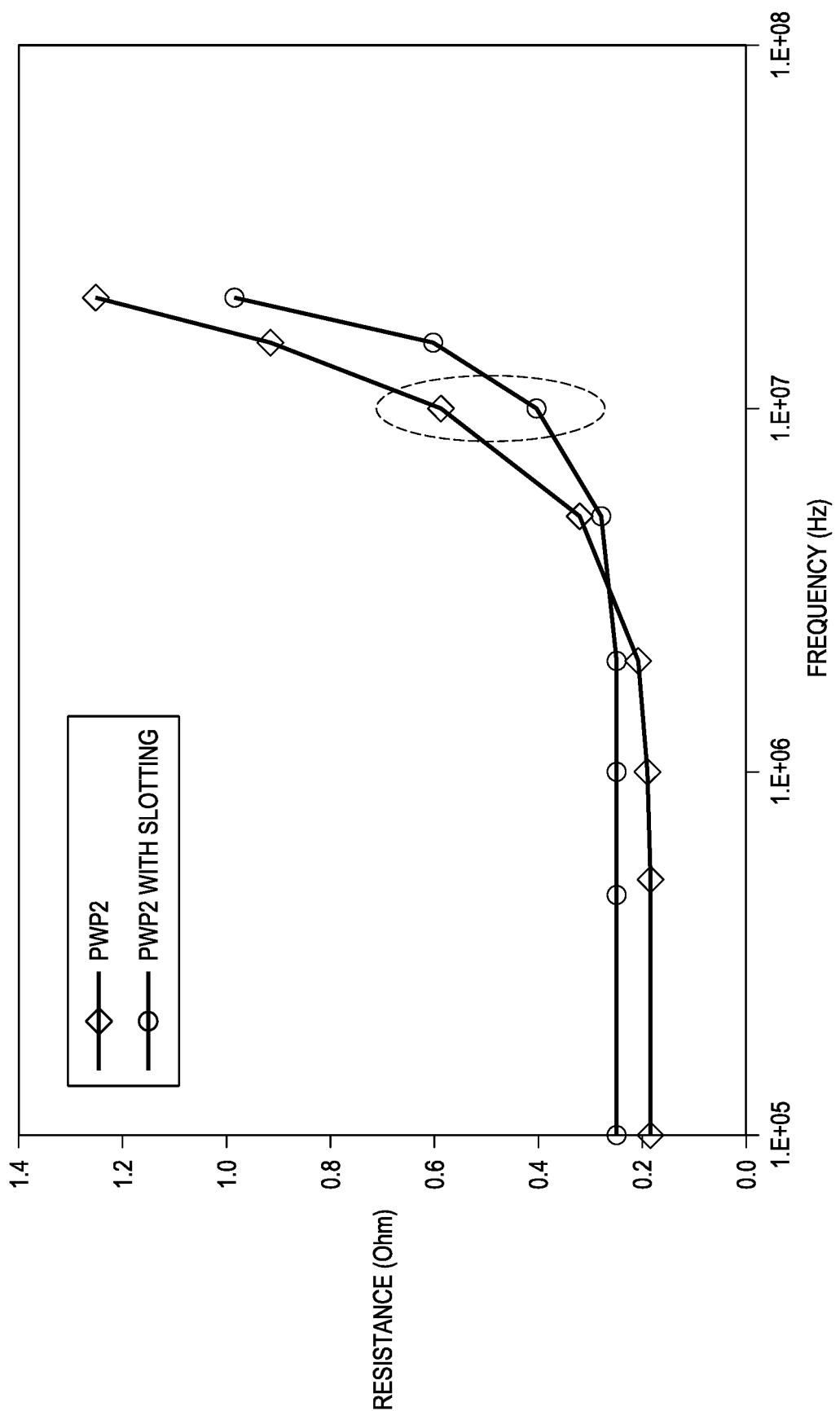
FIG. 4 illustrates series resistance vs frequency for inductors with and without slots in their coils according to embodiments of this invention.
Figure 5:
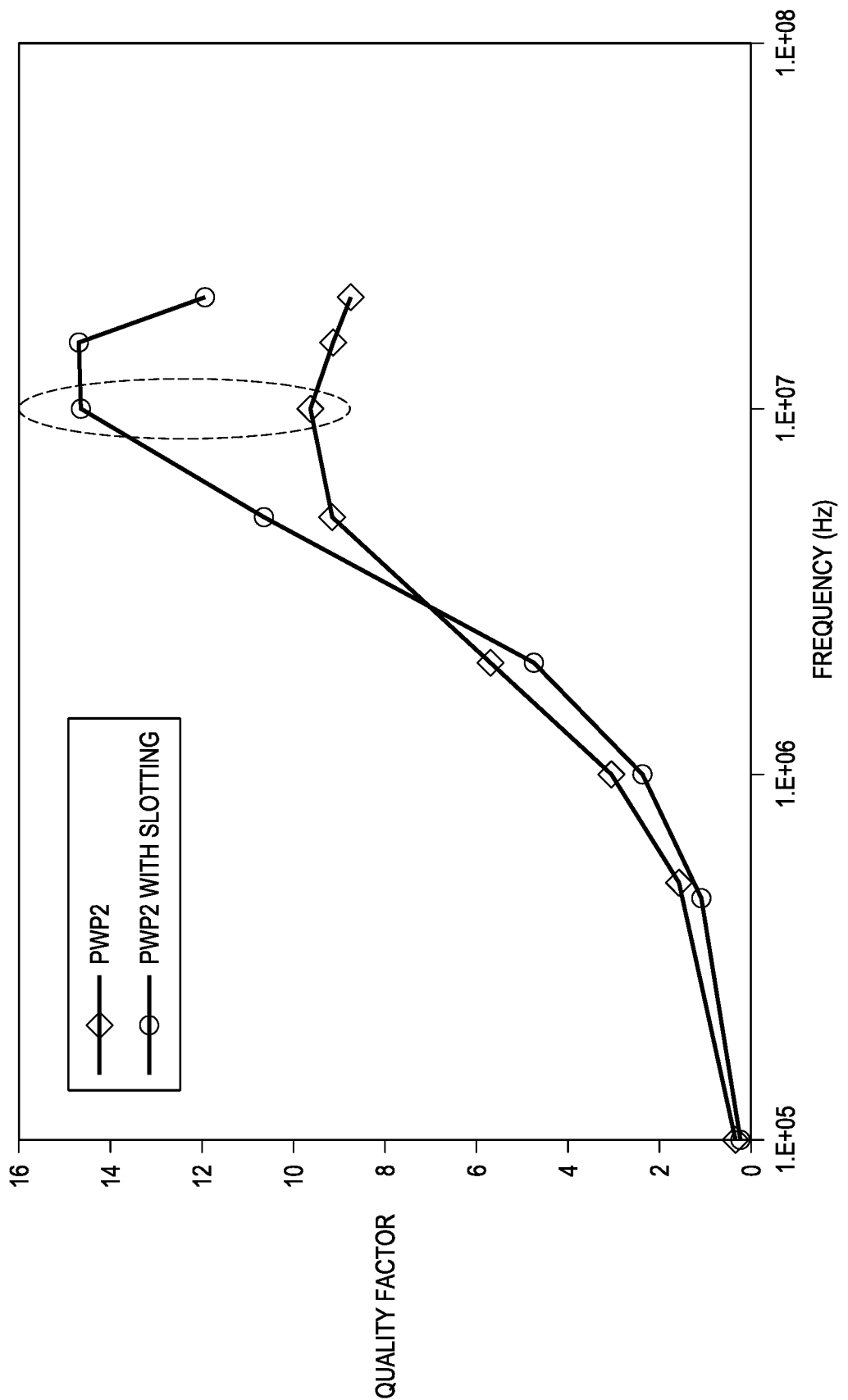
FIG. 5 illustrates inductance quality factor vs frequency for inductors with and without slots in their coils according to embodiments of this invention.

This was verified with simulations where devices PWP2 FIG. 1 and PWP2 with slotting FIG. 2 are compared. Plots of inductance vs frequency show higher inductance with slotting FIG. 3, resistance vs frequency show lower resistance with slotting FIG. 4 and quality factor vs frequency show higher quality factor with slotting FIG. 5.

Introduction of conductor slotting can increase the DC resistance, which is not desirable. Hence to minimize the impact on DC resistance, slotting can be applied to a part of the conductor selectively for example at the two ends of the inductor only. Slotting can be considered as one of design variables in the inductor design.

Introduction of slotting can be done in the mask design, so there is no impact on the process flow or cost. Slotting can be applied to the entire conductor or to portions of the conductor.

Figure 3:
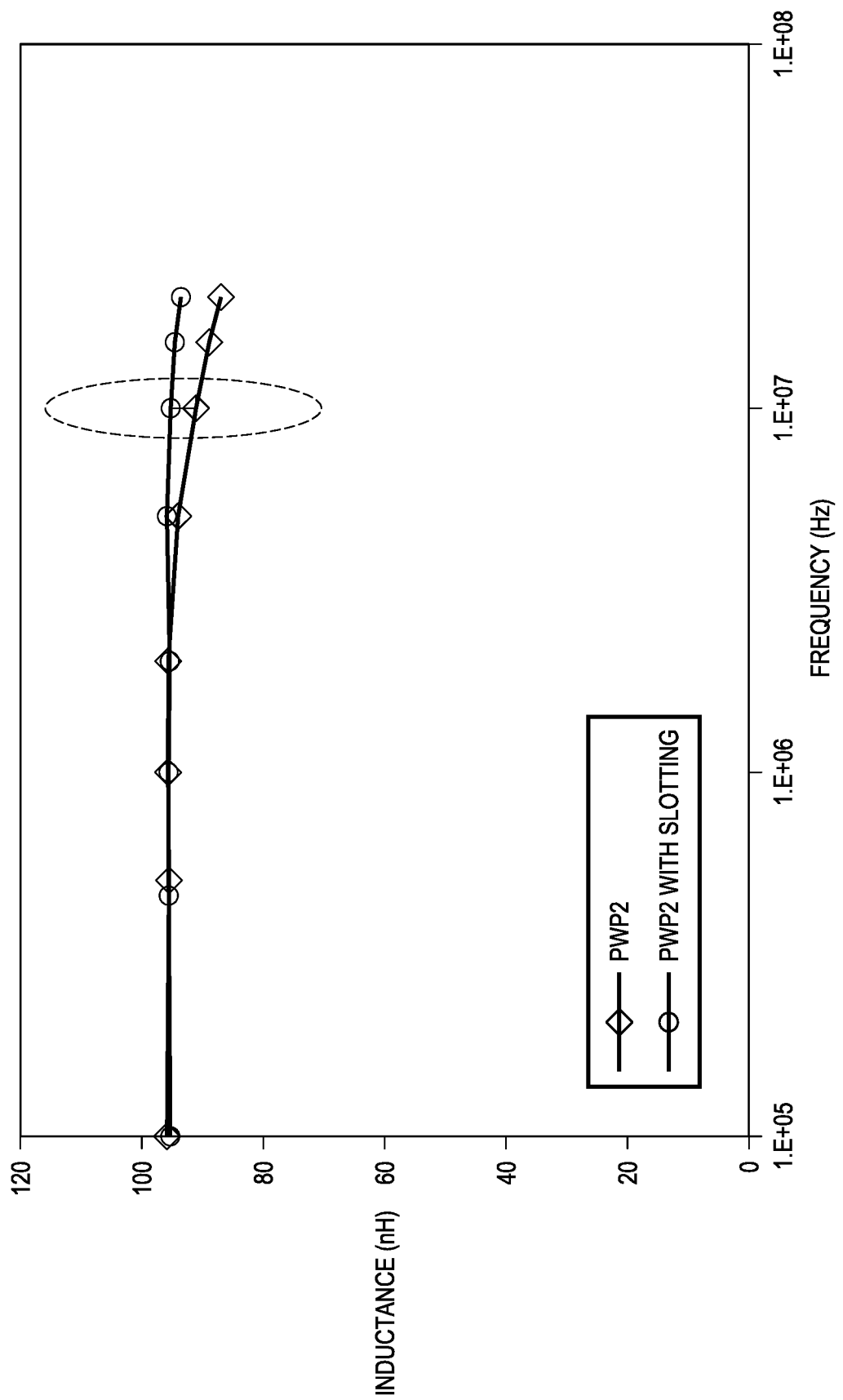
FIG. 3 illustrates inductance vs frequency for inductors with and without slots in their coils according to embodiments of this invention.
Figure 11:
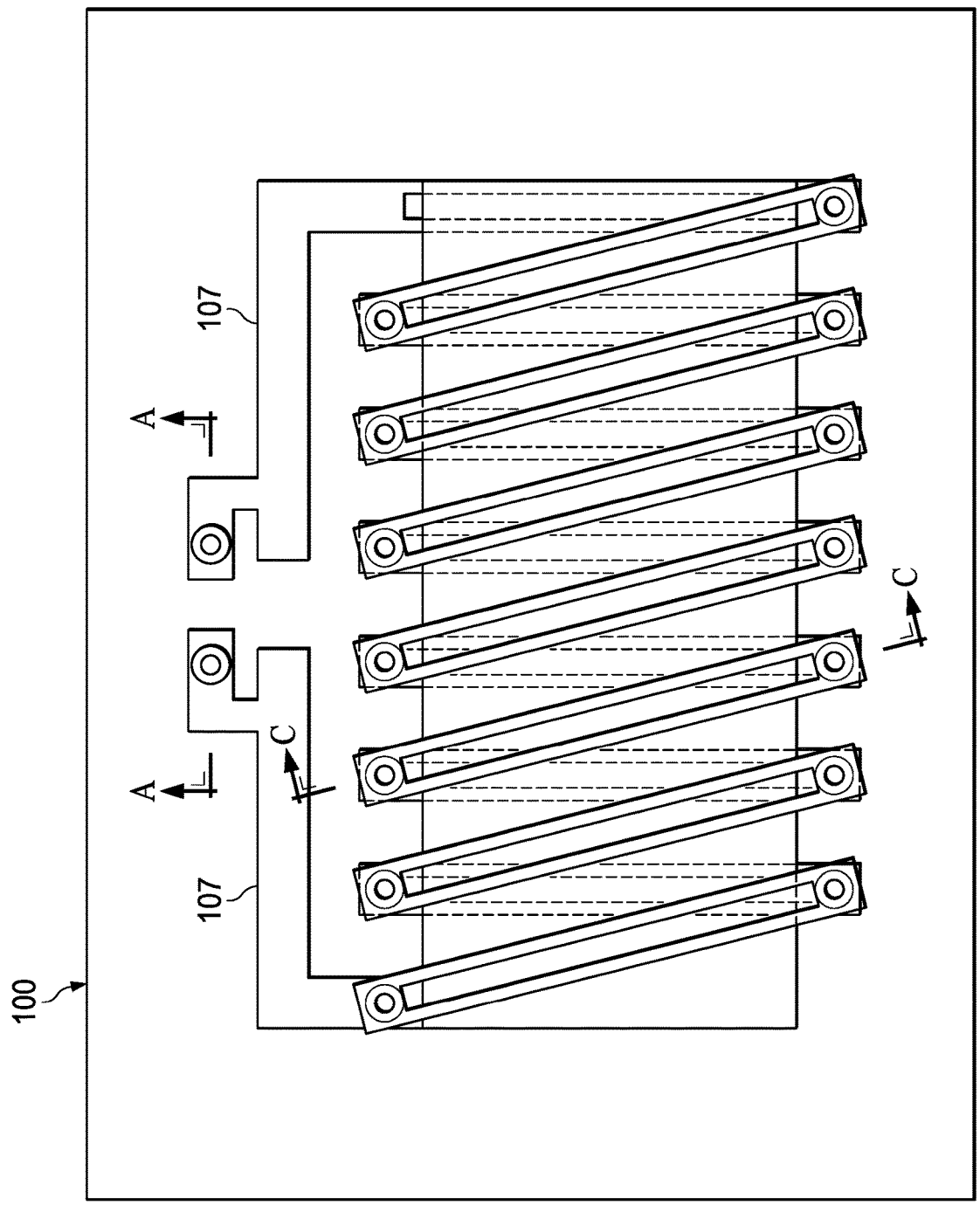
Figure 12:
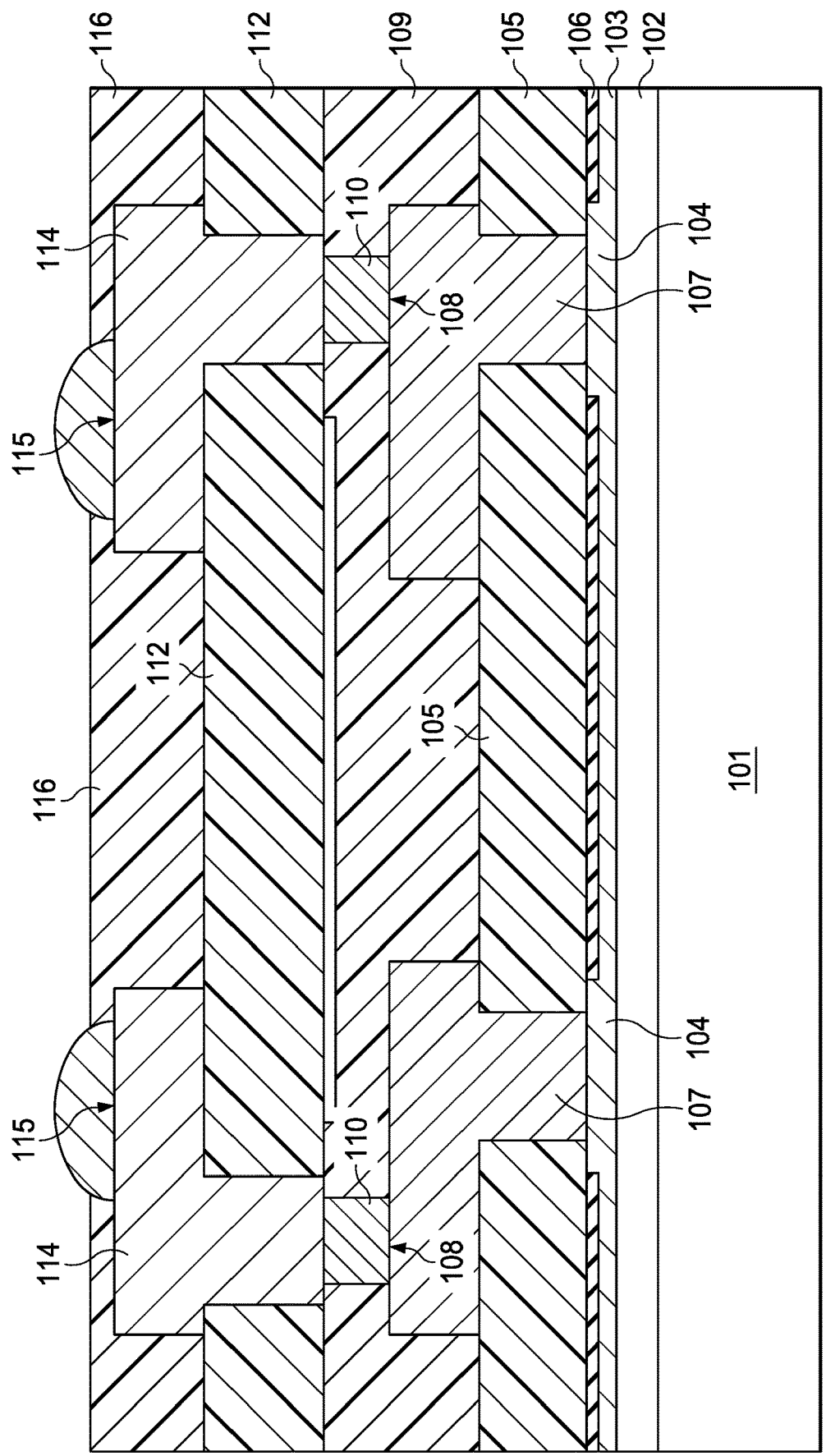
FIG. 12 is an illustration of section AA FIG. 8. according to embodiments of this invention.
Figure 13:
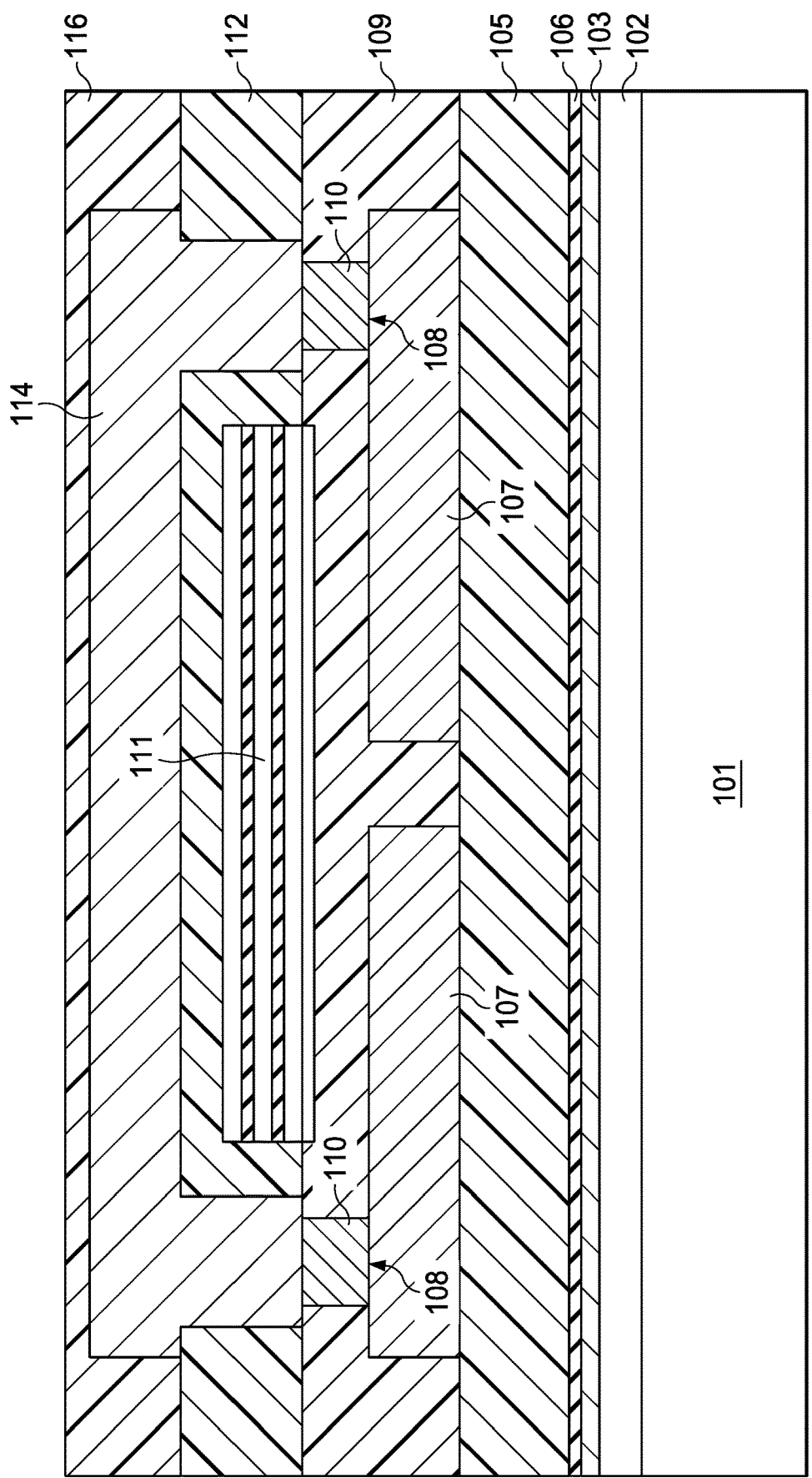
FIG. 13 is an illustration of section BB FIG. 8. according to embodiments of this invention.

FIGS. 12 and 13 are cross sectional views of sections A-A and B-B of FIG. 3, respectively and 14 is a cross sectional view of C-C of FIG. 11.

In an embodiment of the present invention 100, FIG. 12 has a silicon wafer substrate 101. An active region 102 comprising transistors, diodes, capacitors and resistors coupled by a conductive interconnect layer 103 to form an active circuit, wherein the active region 102 touches the top surface of the silicon wafer substrate and includes a first plurality of bond contacts 104. The conductive interconnect layer 103 can be comprised of multiple layers of conductive material with insulating layer therebetween. The multiple layers of conductive material can be coupled together by a first plurality of vias piercing their associated insulating layer, wherein the top of the conductive interconnect layer 103 is an insulating layer, having openings to expose a first plurality of bond contacts 104. Additionally the insulating layer on top of the conductive interconnect layer can be covered by a Silicon Nitride layer 106, having openings to expose the first plurality of bond contacts 104.

A first layer of polymer 105 can be deposited on top of the Silicon Nitride layer and also include a first plurality of openings extending from the top of the first layer of polymer down to the first plurality of bond contacts 104. The first layer of polymer 105 can act as a stress relief layer between the inductor and the silicon wafer. It can be between 5 µm-15 µm in thickness. This can also act to reduce coupling between the copper windings and the silicon wafer substrate 101. The first layer of polymer can be chosen from the group of polymers SU8 or PI-2622.

Figure 6:
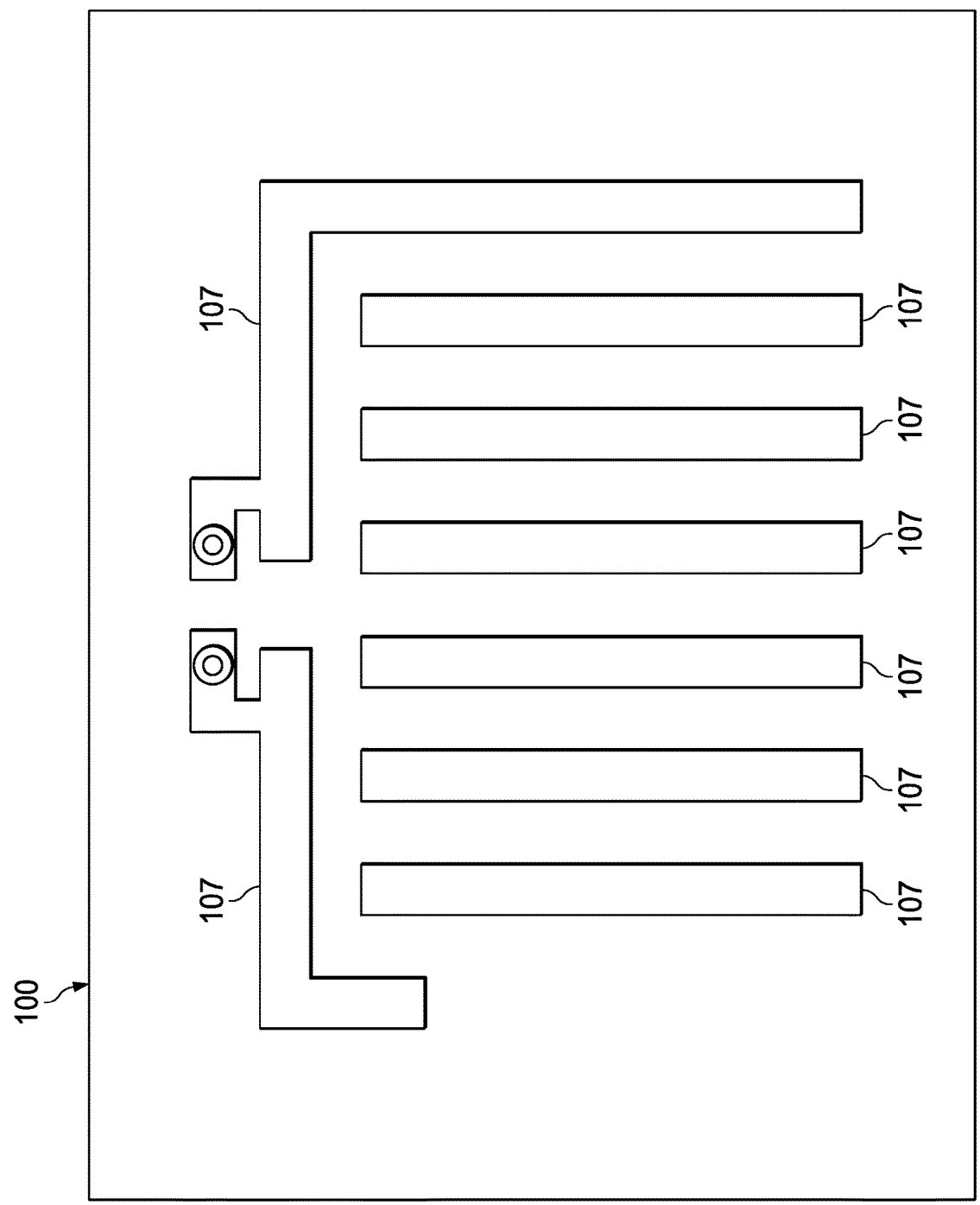
FIGS. 6-8 illustrate the mask process sequence of an inductor without slots in the coils according to embodiments of this invention.
Figure 9:
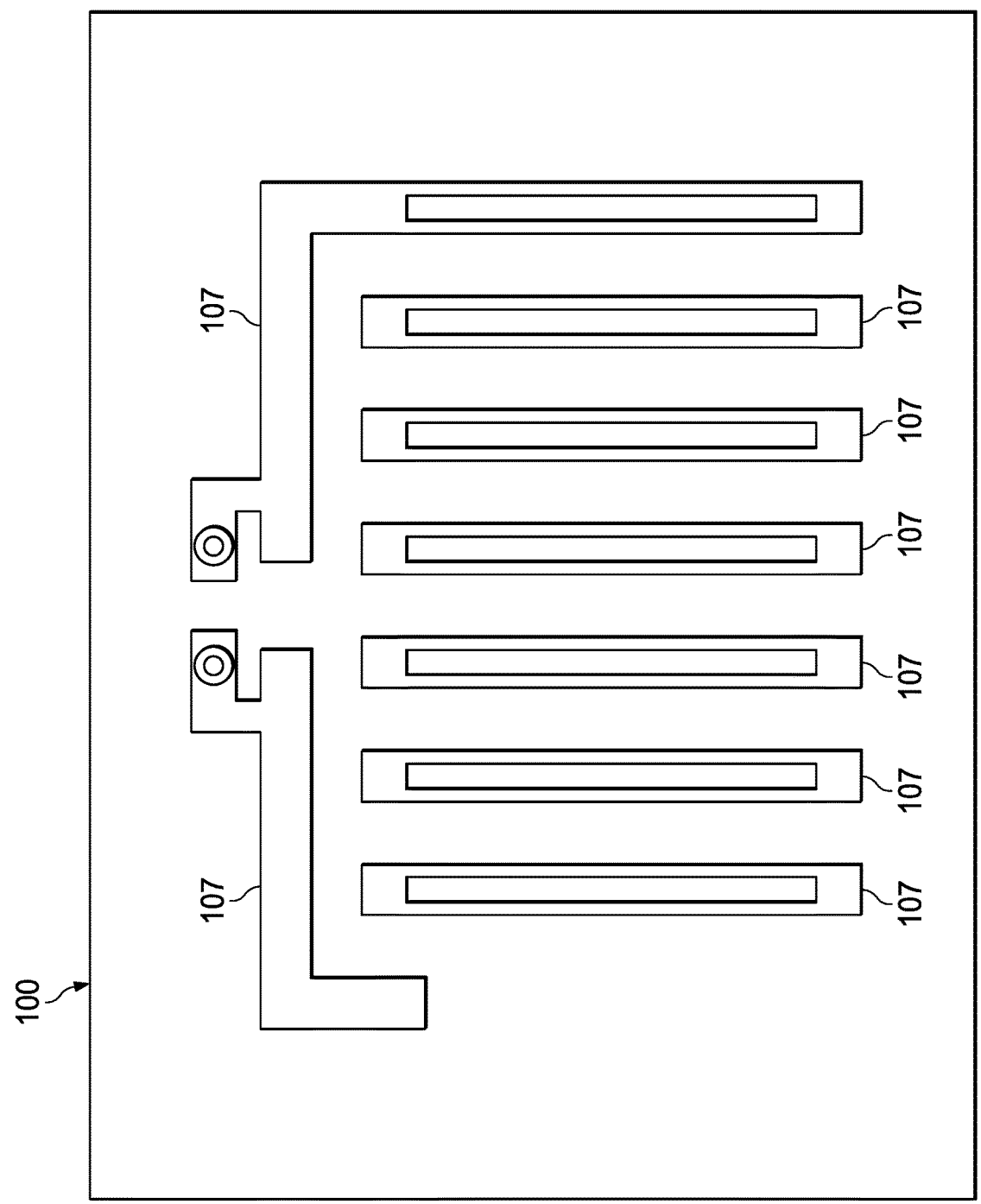
FIGS. 9-11 illustrate the mask process sequence of an inductor with slots in the coils according to embodiments of this invention.

A first layer high conductance material 107 FIGS. 6 and 9 can be deposited on the top surface of the first layer of polymer 105, filling the openings in the first polymer layer forming a second plurality of vias, thereby coupling the first layer of high conductance material 107 to the first plurality of bond contacts 104. The first layer of high conductance material 107 can be configured to form bottom coil members and a coupling means, wherein the bottom coil members can include either slots or no slots and also include a second plurality of bond contacts 108 at the ends of the bottom coil members 107, also wherein the coupling means connects to the first plurality of vias, coupling to the first plurality of bond contacts 104. The first layer of high conductance material 107 can be comprised of copper with a thickness of 20 µm.

A second layer of polymer 109, touching the first layer of polymer 105 and the first layer high conductance material 107 wherein the top surface of the second layer of polymer is planar. The second layer of polymer 109 can include openings extending from the top surface of the second layer of polymer 109 down to the second plurality of contacts 108. The openings in the second layer of polymer can be filled with a third plurality of vias 110. The third plurality of vias 110 can be copper. The second layer of polymer 109 can be chosen from the group of polymers SU8 3000 or PI-2622

Figure 7:
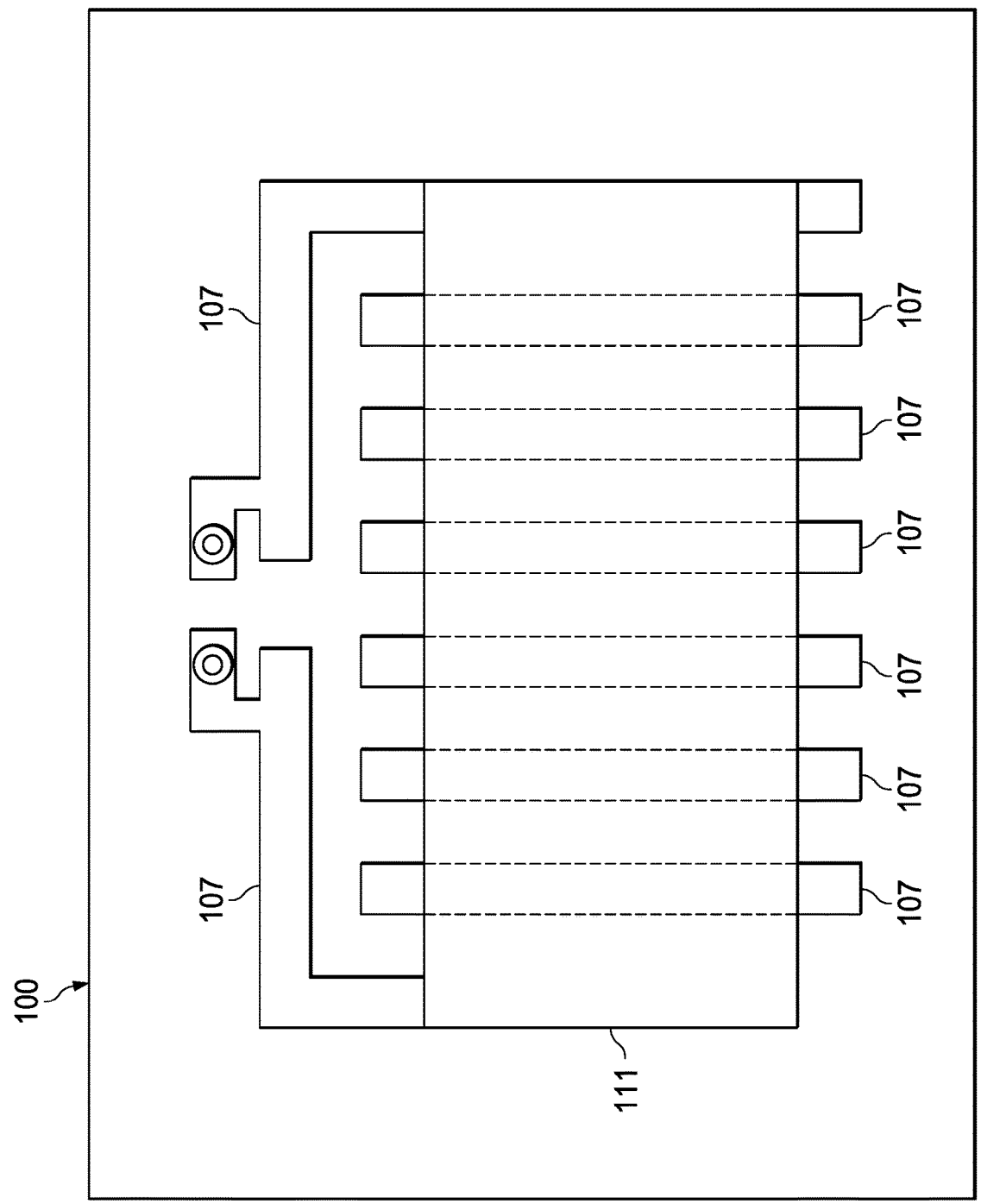
Figure 14:
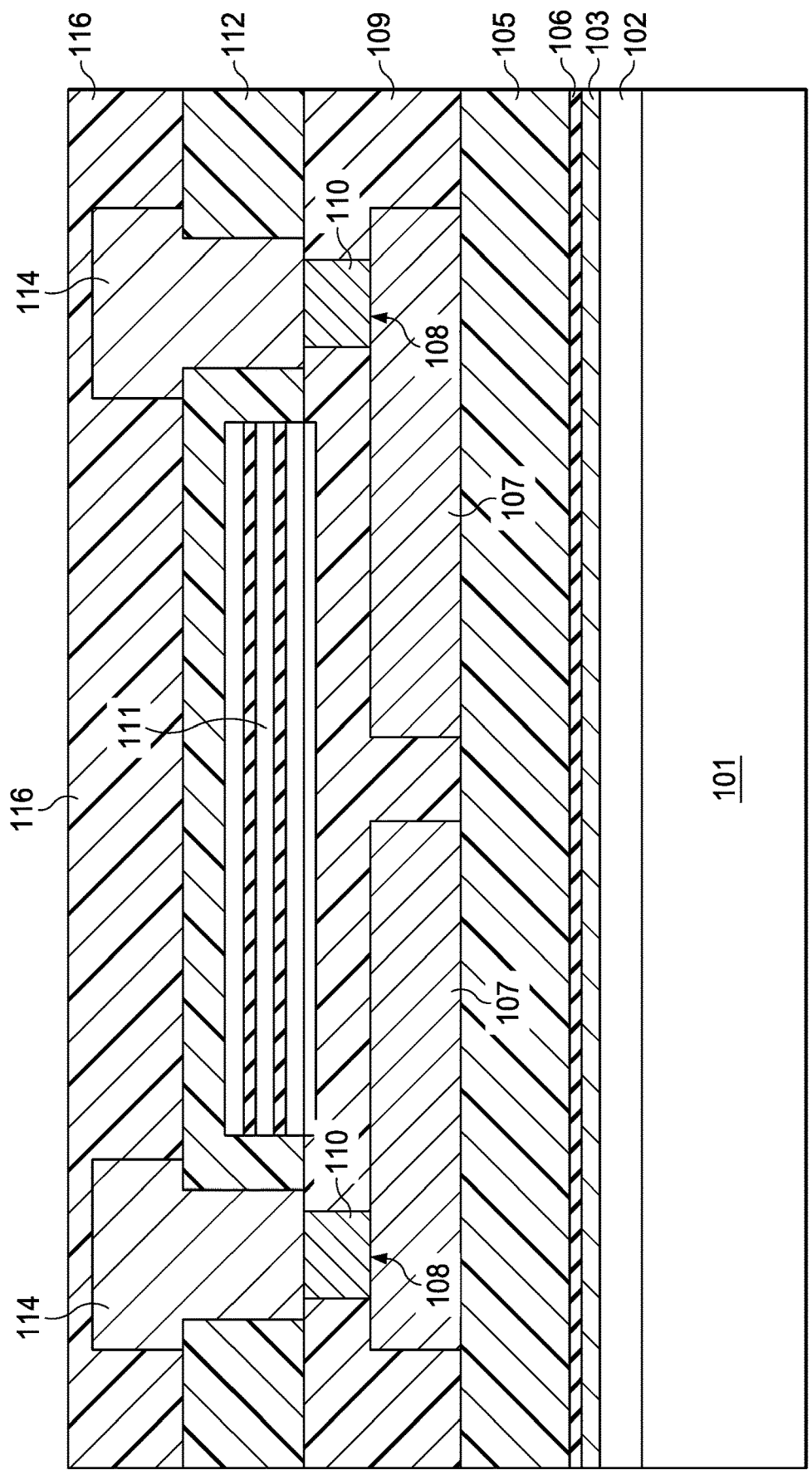
FIG. 14 is an illustration of section CC FIG. 11. according to embodiments of this invention.

A single layer of magnetic material or multiple layers of alternating magnetic material and insulating material 111 FIGS. 7 and 14 can be deposited and defined on the top surface of second layer of polymer 109, wherein the single layer of magnetic core material or the multiple layers of alternating magnetic material and insulating material 111, as defined, do not touch the third plurality of vias 110 exposed on the top surface of the second layer of polymer 109.

The single layer magnetic core is sputtered in the presence of a magnetic field, which defines the easy axis and can have total thickness of between 3-15 µm. The magnetic layer can be selected from the group of Ni80Fe20, Co90Ta5Zr5 or FeAlN and then magnetic layers can be subjected to an anneal (300-500° C.) in the presence of a magnetic field (0.1-1 T) after sputtering.

In the case of the case of alternating magnetic material and insulating material, each magnetic film layer can have thickness ranges from 0.1 μm to 3 μm with a 10 nm AlN dielectric in between. The magnetic film layers can be selected from the group of Ni80Fe20, Co90Ta5Zr5 or FeAlN. The laminated magnetic core total thickness can be between 5-15 μm A third layer of polymer 112 can be deposited next, touching the second layer of polymer 109 and the top of the magnetic core 111. The third layer of polymer can include openings extending from the top surface of the third lay of polymer 112 down to the top surfaces of the third plurality of vias 110.

Figure 8:
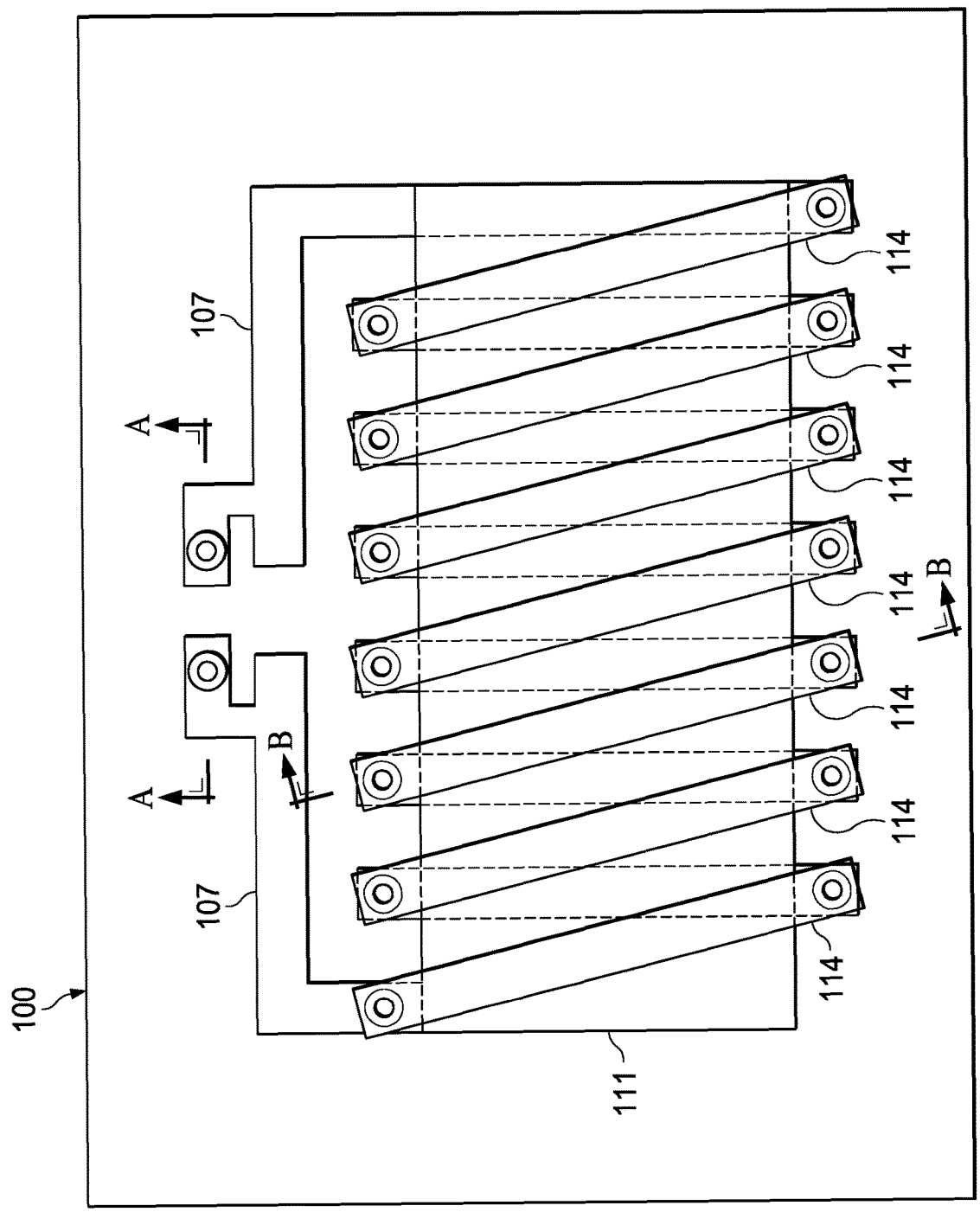

A second layer high conductance material 114 FIGS. 8 and 11 can be deposited on the top surface of the third layer of polymer 112, wherein the second layer of high conductance material 114 fills the openings in the third polymer layer 112 forming a fourth plurality of vias, thereby coupling the second layer of high conductance material 114 to the first plurality of bond contacts 104. The second layer of high conductance material 114 can also be configured with either slots or no slots and include a third plurality of bond contacts 115. The second layer of high conductance material 114 can be comprised of copper with a thickness of 20 μm.

A fourth layer of polymer 116 can be deposited next, touching the third layer of polymer 112 and the top of the second layer high conductance material 114. The fourth layer of polymer can include openings extending from the top surface of the fourth lay of polymer 112 down to the top surfaces second layer high conductance material 114. The openings in the fourth layer of polymer can be filled with solder balls 116, wherein the solder balls provide connection to outside circuitry.

In accordance with another embodiment of this invention, the wafer level integrated inductor is fabricated by providing a conventionally formed integrated circuit wafer 101, 102 and 103 wherein the bond contacts 104 of each of the integrated circuits are exposed through openings in the insulating layer at the top of the conductive interconnect layer 103.

A layer of silicon nitride is deposited over the wafer, touching the insulating layer at the top of the conductive interconnect layer 103 and the bond pads 104 exposed through the openings in the insulating layer at the top of the conductive interconnect layer 103. Using a pattern and etch process, the bond contacts 104 are exposed through openings in the silicon nitride layer.

A first layer of polymer 105 is spun onto the wafer and baked to cure the polymer layer. A patterned hard mask is deposited on the wafer touching the top surface of the first polymer 105. Openings are etched into the first polymer layer 105 extending from the top surface of the first polymer layer 105 down to the plurality of bond contacts 104. The hard mask is then removed.

A mold mask is deposited and patterned onto the surface and the first layer of high conductance material 107 is then electroplated on the surface of the first polymer layer 105, filling the openings in the first polymer layer forming a second plurality of vias, thereby coupling the first layer of high conductance material to the first plurality of bond contacts 104. The first layer of high conductance material then forms the bottom coil members and a coupling means, wherein the bottom coil members can include either slots or no slots and also include a second plurality of bond contacts 108 at the ends of the bottom coil members 107, also wherein the coupling means connects to the first plurality of vias, coupling to the first plurality of bond contacts 104. The mold mask is stripped off the surface after the electroplating step. The first layer of high conductance material can be composed of 20 μm of copper and can be configured with or without slots.

A second layer of polymer 109 can be deposited next, touching the first layer of polymer 105 and the first layer high conductance material 107 wherein the top surface of the second layer of polymer 109 is planar. The second layer of polymer 109 can include openings extending from the top surface of the second layer of polymer down through 109 to the second plurality of contacts 108. The openings in the second layer of polymer can include a third plurality of vias 110, thereby coupling the third plurality of vias 110 to the first plurality of bond contacts 104. The third plurality of vias 110 can be copper electroplated on the surface of the second polymer layer 109 through a mold mask, filling the openings in the second polymer layer. The second layer of polymer 109 can be chosen from the group of polymers SU8 3000 or PI-2622. If PI-2622 is used, a CMP process can be used to planarize the surface. If SU8 3000 is used instead of PI-2622 for the second Polymer layer 109, CMP is not required because SU8 3000 is largely self-planarizing to the required tolerance.

A layer of titanium can be sputtered on the top surface of the second layer of polymer 109 touching the second layer of polymer 109 and the tops of the third plurality of vias 110.

Figure 10:
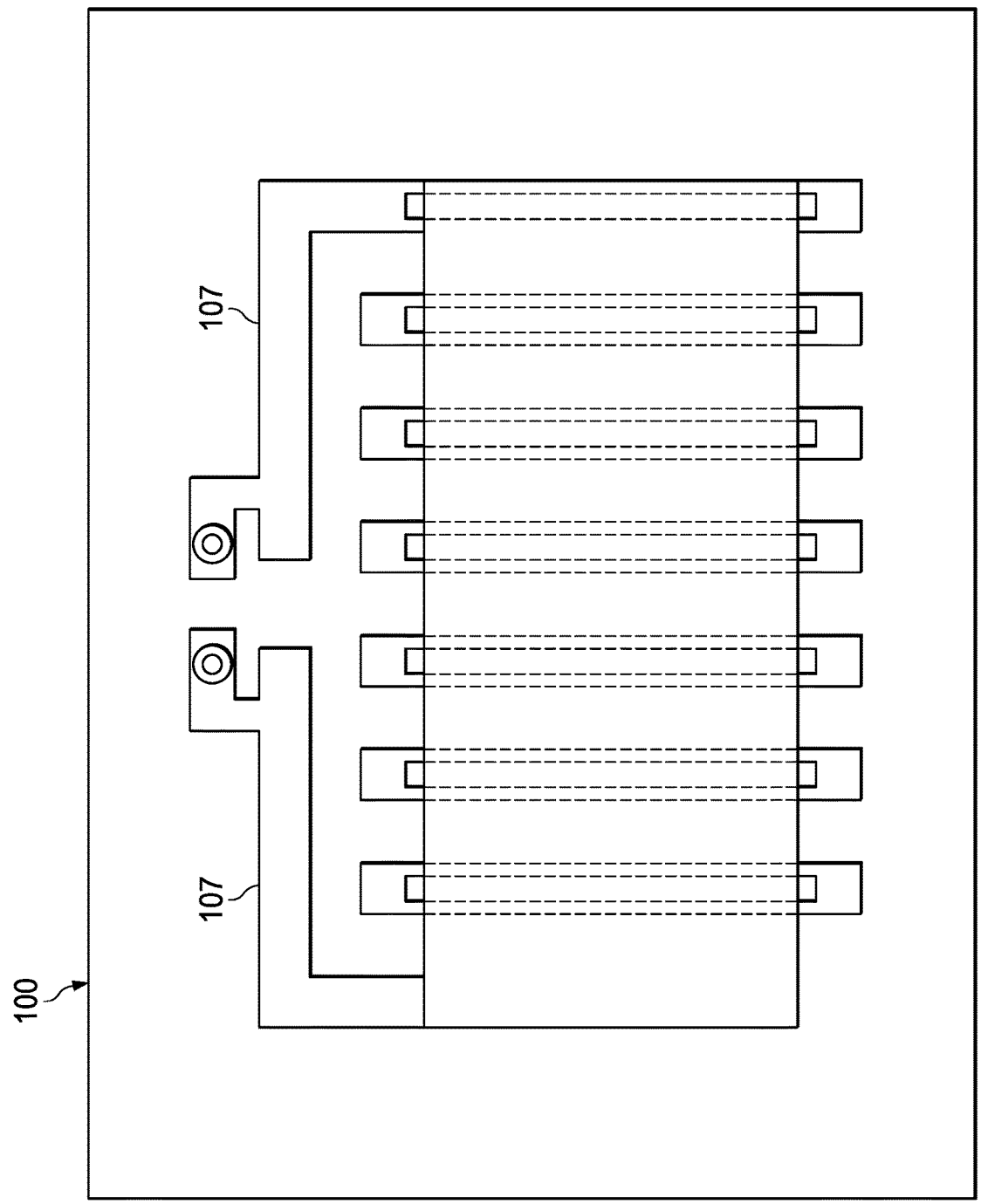

A single layer of magnetic core material or a laminated magnetic core 111 comprised of multiple layers of alternating magnetic material and insulating material FIGS. 7 and 10 can be deposited using a Veeco Nexus PVDi Tool in a magnetic field on the top surface of second layer of polymer 109, wherein the single layer of magnetic core material or multiple layers of alternating magnetic material and insulating material 111 are defined to not touch the third plurality of vias 110 exposed on the top surface of the second layer of polymer 109.

The single layer magnetic core is sputtered and can have total thickness of between 3-15 μm. The magnetic layer can be selected from the group of Ni80Fe20, Co90Ta5Zr5 or FeAlN and then magnetic layers can be subjected to an anneal (300-500 C) in the presence of a magnetic field (0.1-1 T) after sputtering.

In the case of the laminated core, each magnetic film layer can be sputtered, with thickness ranges from 0.1 μm to 3 μm with a 10 nm AlN dielectric therebetween. Sputtering can be in the presence of a magnetic field to determine the easy axis of the magnetic material. The orientation in the multiple layers of alternating magnetic material and insulating material 111 due to the imposed B-field during the sputtering process is in the direction of the easy axis. The easy axis is perpendicular to the hard axis. The hard axis is the axis along which the magnetic field, generated by the final inductor in normal operation, will flow through the core. The magnetic layers can be selected from the group of Ni80Fe20, Co90Ta5Zr5 or FeAlN. The magnetic layers can be subjected to an anneal (300-500 C) in the presence of a magnetic field (0.1-1 T) after sputtering. This acts to further define the easy/hard axes. The laminated magnetic core 111 total thickness can be between 3-15 μm Standard photo resist process can be used to define the etch pattern for the magnetic core 111. The single layer of magnetic material or the multiple layers of alternating magnetic material and insulating material and the Ti adhesion layer can then be etched. The photoresist is then stripped using standard techniques.

A third layer of polymer 112 can be deposited next, touching the second layer of polymer 109 and the first plurality of vias 110 and the top of the magnetic core 111. The third layer of polymer can include openings extending from the top surface of the third layer of polymer 112 down through the third layer of polymer 112 to the third plurality of vias 110.

A mold mask is then deposited and patterned on to the polymer layer 112, and a second layer of high conductance material 114 is then electroplated on the surface of the third polymer layer 112, filling the openings in the third polymer layer 112, forming a fourth plurality of vias, thereby coupling the third layer of high conductance material 114 to the first plurality of bond contacts 104. The second layer of high conductance material can be composed of 20 μm of copper and can be configured with or without slots.

A fourth layer of polymer 116 can be deposited next, touching the third layer of polymer 112 and the second layer of high conductance material 114. The fourth layer of polymer 116 can include openings extending from the top surface of the fourth layer of polymer 116 down through the fourth layer of polymer 116 to the second layer of high conductance material 114.

The magnetic layers can be subjected to a second anneal (300-500 C) in the presence of a magnetic field (0.1-1 T). This acts to further define the easy/hard axes.

Finally solder bumps are formed in the openings formed in the fourth layer of polymer 116 touching the second layer of high conductance material 114.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated circuit, comprising;
a magnetic core located over a substrate; and
a winding around the magnetic core, the winding including first and second pluralities of coil members, the first plurality of coil members located between the magnetic core and the substrate, and the magnetic core located between the first and second pluralities of coil members,
wherein at least one coil member of the first or second plurality of coil members includes a slot that extends along the at least one coil member, the slot intersecting first and second opposing surfaces of the at least one coil member thereby creating first and second separate current paths through the at least one coil member, each of the first and second separate current paths running parallel to and having a same height above the substrate and being connected only at opposing ends in a longer length direction of the slot.

2. The integrated circuit of claim 1, wherein the slot is a first slot, and each coil member of the first plurality of the coil members includes a respective slot among a first plurality of slots corresponding to the first plurality of coil members, and each coil member of the second plurality of coil members includes a respective slot among a second plurality of slots corresponding to the second plurality of coil members, the first slot belonging to the first or second pluralities of slots.

3. The integrated circuit of claim 1, wherein the at least one coil member is connected to a first adjacent coil member by a first via and to a second adjacent coil member by a second via, and the slot extends between the first and second vias.

4. The integrated circuit of claim 1, wherein all of the coil members in the winding are slotted.

5. The integrated circuit of claim 1, wherein the magnetic core include a plurality of laminated layers.

6. The integrated circuit of claim 1, wherein the magnetic core comprises $N_{80}Fe_{20}$, $Co_{90}Ta_5Zr_5$ or FeAlN.

7. The integrated circuit of claim 1, wherein the first and second pluralities of coil members are copper.

8. The integrated circuit of claim 1, further comprising a dielectric layer between the first and second pluralities of coil members and an interconnect layer, the dielectric layer including a polymer layer between the first plurality of coil members and the interconnect layer, and the dielectric layer further including a silicon nitride layer between the polymer layer and the interconnect layer.

9. The integrated circuit of claim 1, wherein a proper subset of the coil members of the first and second pluralities of coil members are slotted.

10. The integrated circuit of claim 1, wherein the first plurality of coil members includes the at least one coil member, a second slotted coil member and a third coil member with no slot, the third coil member connected in series between the first and second coil members.

11. A method of forming an integrated circuit, comprising;
forming a magnetic core layer over a substrate;
forming first and second pluralities of coil members, the first plurality of coil members being located between the magnetic core layer and the substrate, the magnetic core layer being located between the first and second pluralities of coil members; and
forming a slot through at least one coil member of the first or second pluralities of coil members, the slot extending along a length direction of the at least one coil member, the slot intersecting first and second opposing surfaces of the at least one coil member thereby creating through the at least one coil member two separate current paths being parallel to and having a same height above the substrate and being connected only at opposing ends in a longer length direction of the slot.

12. The method of claim 11, wherein the slot is a first slot, and each coil member of the first plurality of the coil members includes a respective slot among a first plurality of slots corresponding to the first plurality of coil members, and each coil member of the second plurality of coil members includes a respective slot among a second plurality of slots corresponding to the second plurality of coil members, the first slot belonging to the first or second pluralities of slots.

13. The method of claim 11, further comprising connecting the at least one coil member to a first adjacent coil member by a first via and to a second adjacent coil member by a second via, and the slot extends between the first and second vias.

14. The method of claim 11, wherein all of the coil members of the winding are slotted.

15. The method of claim 11, wherein the magnetic core includes a plurality of laminated layers.

16. The method of claim 11, wherein the magnetic core comprises $Ni_{80}Fe_{20}$, $Co_{90}Ta_5Zr_5$ or FeAlN.

17. The method of claim 11, wherein the first and second pluralities of coil members are copper.

18. The method of claim 11, further comprising forming a dielectric layer between the first and second pluralities of coil members and an interconnect layer, the dielectric layer including a polymer layer between the first plurality of coil members and the interconnect layer, and the dielectric layer further including a silicon nitride layer between the polymer layer and the interconnect layer.

19. The method claim 11, wherein the second plurality of coil members includes the at least one coil member, a second slotted coil member and a third coil member with no slot, the third coil member connected in series between the first and second coil members.

20. A method of forming an integrated circuit, comprising;
   forming a magnetic core layer over a substrate;
   forming first and second pluralities of coil members, the first plurality of coil members being located between the magnetic core layer and the substrate, the magnetic core layer being located between the first and second pluralities of coil members;
   forming a slot through at least one coil member of the first and second pluralities of coil members, the slot extending along the at least one coil member and being connected only at opposing ends in a longer length direction of the slot; and
   forming a dielectric layer between the first and second pluralities of coil members and an interconnect layer, the dielectric layer including a polymer layer between the first plurality of coil members and the interconnect layer, and the dielectric layer further including a silicon nitride layer between the polymer layer and the interconnect layer.

21. An integrated circuit, comprising;
   a magnetic core located over a substrate;
   a winding around the magnetic core, the winding including first and second pluralities of coil members, the first plurality of coil members located between the magnetic core and the substrate, and the magnetic core located between the first and second pluralities of coil members,
   wherein the second plurality of coil members includes first, second and third coil members, the third coil member connected in series between the first and second coil members, the first coil member having a first slot that extends along the first coil member, the second coil member having a second slot that extends along the second coil member, and the third coil member having no slot.

22. An integrated circuit, comprising;
   a magnetic core located over a substrate; and
   a winding around the magnetic core, the winding including first and second pluralities of coil members, the first plurality of coil members located between the magnetic core and the substrate, and the magnetic core located between the first and second pluralities of coil members,
   wherein at least one coil member of the first or second plurality of coil members includes a slot that extends along the at least one coil member, the slot intersecting first and second opposing surfaces of the at least one coil member thereby creating first and second separate current paths through the at least one coil member, each of the first and second separate current paths running parallel to and having a same height above the substrate, and a proper subset of the coil members of the first and second pluralities of coil members are slotted.

23. An integrated circuit, comprising;
   a magnetic core located over a substrate; and
   a winding around the magnetic core, the winding including first and second pluralities of coil members, the first plurality of coil members located between the magnetic core and the substrate, and the magnetic core located between the first and second pluralities of coil members,
   wherein at least one coil member of the first or second plurality of coil members includes a slot that extends along the at least one coil member, the slot intersecting first and second opposing surfaces of the at least one coil member thereby creating first and second separate current paths through the at least one coil member, each of the first and second separate current paths running parallel to and having a same height above the substrate, and the first plurality of coil members includes the at least one coil member, a second slotted coil member and a third coil member with no slot, the third coil member connected in series between the at least one coil member and the second slotted coil member.

* * * * *